(12) United States Patent
Carney et al.

(10) Patent No.: US 8,923,124 B1
(45) Date of Patent: Dec. 30, 2014

(54) DATA UNIT COUNTER

(75) Inventors: John C. Carney, Bedford, MA (US); Thomas Radogna, Westboro, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 1641 days.

(21) Appl. No.: 11/342,625

(22) Filed: Jan. 31, 2006

(51) Int. Cl.
*H03K 21/38* (2006.01)
*H04L 1/00* (2006.01)

(52) U.S. Cl.
USPC ........................................................ 370/235

(58) Field of Classification Search
CPC ....... H03K 21/38; H04L 1/00; H04L 43/0894
USPC ..................... 709/224; 710/316, 52
See application file for complete search history.

(56) References Cited

U.S. PATENT DOCUMENTS

| | | | | |
|---|---|---|---|---|
| 5,587,997 A * | 12/1996 | Jacobson | ...................... | 370/253 |
| 5,909,564 A * | 6/1999 | Alexander et al. | ............ | 710/316 |
| 5,991,299 A * | 11/1999 | Radogna et al. | ................ | 370/392 |
| 6,304,900 B1 * | 10/2001 | Cromer et al. | ................ | 709/221 |
| 6,453,408 B1 * | 9/2002 | Fiske et al. | ...................... | 712/29 |
| 2002/0150117 A1 * | 10/2002 | Baba | ............................. | 370/442 |
| 2004/0109412 A1 * | 6/2004 | Hansson et al. | ............... | 370/229 |
| 2004/0260852 A1 * | 12/2004 | Olstad et al. | ................... | 710/200 |
| 2005/0060574 A1 * | 3/2005 | Klotz et al. | .................... | 713/201 |
| 2005/0154839 A1 * | 7/2005 | DeWitt et al. | ................. | 711/144 |
| 2005/0198350 A1 * | 9/2005 | Tan et al. | ...................... | 709/232 |
| 2005/0213504 A1 * | 9/2005 | Enomoto et al. | .............. | 370/235 |
| 2005/0249206 A1 * | 11/2005 | Wybenga et al. | .............. | 370/389 |
| 2006/0165009 A1 * | 7/2006 | Nguyen et al. | ................ | 370/252 |
| 2006/0265526 A1 * | 11/2006 | Holbrook | ........................ | 710/52 |

OTHER PUBLICATIONS

Radogna, Tom. "OC48 Statistics FPGA Hardware Specification", Revision 1.2, Redstone Communications Corporation, Mar. 28, 2002, 18 pages.

Radogna, Tom. "Token Bucket and Statistics FPGA Hardware Specification", Revision 1.7, Redstone Communications Corporation, May 2, 2006, 27 pages.

* cited by examiner

*Primary Examiner* — Melanie Jagannathan
*Assistant Examiner* — Jason Harley
(74) *Attorney, Agent, or Firm* — Harrity & Harrity, LLP

(57) ABSTRACT

A network device may include first logic configured to count data units passing through the network device and to produce a counter value. The network device may include second logic configured to receive the counter value when an indicator is present, and to store the counter value. The network device may include third logic configured to sample the second logic, to receive the counter value, and to operate on the counter value to produce a result.

32 Claims, 6 Drawing Sheets

400

| ADDRESS 410 | VALUE 420 | MISC. 430 |
|---|---|---|
| 0001 | 0010 | |
| 0010 | 0101 | |
| 0011 | 1001 | |
| 0100 | 1111 | |
| | | |
| | | |

DATA UNIT COUNTER

FIELD OF THE INVENTION

Implementations consistent with the principles of the invention relate generally to network communication and, more particularly, to techniques for counting data units in a network device.

BACKGROUND

Network devices, such as routers, are used to send and receive packets in a network. Monitoring internal devices operating in a network device and/or links serving a network device may involve maintaining statistics about packets entering or leaving the network device. For example, statistics may be maintained on the number of packets entering or leaving the network device via a link, such as by using counters to count the number of packets entering or leaving the network device.

Since modern network devices operate at very high speeds, counters may need to be implemented in fast logic to adequately count incoming and/or outgoing packets. Since fast logic can be expensive, fast counters may be implemented in limited sizes (i.e., the number of bits that the counter can accommodate). As a result, fast counters may need to be read at high rates to ensure that a counter is sampled before it rolls (i.e., before the counter reaches its maximum value and writes over that maximum value). Meaningful counter data may be lost when a counter rolls, so maintaining adequate sampling rates for counters operating in a network device may be important to gathering meaningful statistics about the performance of the network device. Sampling fast counters at high rates may place undesirably high loadings on the control logic for the network device and may hinder network device performance.

SUMMARY

In accordance with an aspect, a device is provided that may include logic configured to receive data from one of the plurality of counters when an indicator is present and to store the received data. The logic may be configured to send the received data to a requesting device that uses the received data to produce statistics about a network device.

In accordance with another aspect, a network device may include first logic configured to count data units passing through the network device and to produce a counter value. The network device may include second logic configured to receive the counter value when an indicator is present, and to store the counter value. The network device may include third logic configured to sample the second logic, to receive the counter value, and to operate on the counter value to produce a result.

In accordance with yet another aspect, a method for counting data units is provided. The method may include receiving a counter value from one of a plurality of data unit counters when an indicator is present. The method may include storing the counter value and receiving a request for a plurality of counter values that include the counter value. The method may include sending the plurality of counter values to a requesting device that operates on the plurality of counter values to produce statistics about the data units.

In accordance with still another aspect, a network device may include means for producing a counter value based on a number of counted data units and means for reading the counter value at a first rate. The network device may include means for storing the counter value and means for sampling the reading means at a second rate that is slower than the first rate to obtain the stored counter value. The method may include means for operating on the stored counter value to produce a result and means for providing the result to a user.

BRIEF DESCRIPTION OF THE DRAWINGS

The accompanying drawings, which are incorporated in and constitute a part of this specification, illustrate implementations of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary implementations consistent with principles of the invention facilitate gathering information that can be used to maintain statistics about the performance of a network device. Implementations may employ high speed counters that provide notifications and counter values to notification logic. The notification logic may receive counter values at a rate that is configured to substantially eliminate the possibility that a counter rolls (i.e., overwrites a counter value) before the counter provides its value to the notification logic. The notification logic may provide values for one or more counters to control logic, such as a processor, operating on the network device. The processor may be configured to sample the notification logic at a rate which is below the rate at which the notification logic receives values from one or more counters. As a result, sampling loads on the processor may be less than if the processor had to obtain counter values directly from the counter. Moreover, notification logic can be implemented in logic that is wider than the logic used to implement counters (i.e., notification logic may use more bits to represent values as compared to the number of bits used by a counter to represent a value).

A "data unit," as used herein, may refer to any type of machine-readable data having substantially any format that may be adapted for use in one or more networks, such as a public network and/or private network. A data unit may include packet data and/or non-packet data.

First Exemplary Implementation

Figure 1:
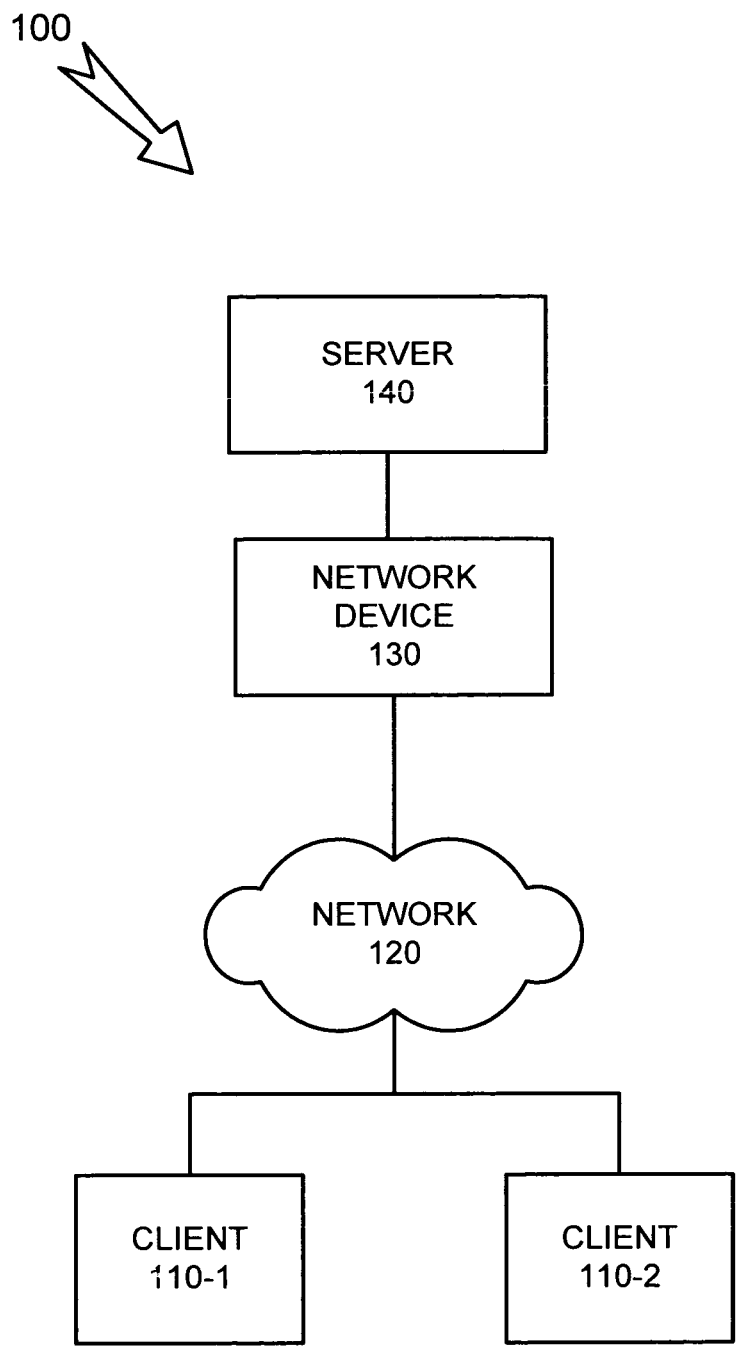
FIG. 1 is a diagram of an exemplary network in which systems and methods consistent with the principles of the invention may be implemented.

FIG. 1 is a diagram of an exemplary network 100 in which systems and methods consistent with the principles of the invention may be implemented. Network 100 may include, among other things, a client 110-1 and 110-2 (hereinafter, collectively client 110), a network 120, a network device 130, and a server 140. While network 100 is shown to include a particular number and arrangement of elements, network 100 may include fewer, more, different, or differently arranged elements in other implementations consistent with the principles of the invention. In addition, network 100 may include the illustrated elements, and other elements, in alternative configurations consistent with the principles of the invention. For example, network device 130 may be located between client 110 and network 120.

Client 110 may include a device configured to send a data unit to network 100 and/or to receive a data unit from network 100. Client 110 may be associated with a person, such as a user. For example, clients 110-1 and 110-2 may represent subscribers of communication services provided by server 140. Client 110 may include a desktop computer, a laptop computer, a personal digital assistant (PDA), a web enabled cellular telephone, a wireless fidelity (Wi-Fi) device, or another type of device that is operated by a user to communicate with a destination device, such as server 140. Client 110 may communicate with other devices, such as other clients, network device 130 and/or server 140, by sending, for example, data units, such as packets.

Network 120 may include a network, or combination of networks, capable of transporting data units. For example, network 120 may include a local area network (LAN), a metropolitan network (MAN), or a wide area network (WAN), such as the Internet. Network 120 may include hard-wired connections, such as shielded twisted pairs, coaxial cables, optical fibers, and/or waveguides. Alternatively, network 120 may include wireless links, such as free space optical links, and/or free space acoustic links. Network 120 may operate using substantially any protocol, such as asynchronous transfer mode (ATM), synchronous optical transport (Sonet), Internet Protocol (IP), public switched telephone network (PSTN), or Bluetooth.

Network device 130 may include a device capable of receiving a data unit via a network. In one implementation, network device 130 may include an in-line device operating as an edge device between a first network and a destination device that may be operating on a second network. For example, network device 130 may operate as an edge device between an untrusted network, such as the Internet, and a trusted network, such as a corporate LAN. "Inline network device" may refer to any network device operating in a manner whereby all, or substantially all, data units intended for a destination device pass through the network device before reaching the destination device. Network device 130 may include devices such as routers, gateways, firewalls, switches, and/or servers. For example, network device 130 may operate as a router in cooperation with server 140 to provide communication services to a number of subscribers, such as client 110-1 and 110-2.

Server 140 may include a device capable of receiving a data unit from and transmitting a data unit to another device and/or network. For example, server 140 may include a workstation, desktop computer, laptop computer, PDA, web enabled cellular telephone, Wi-Fi device, or another type of device. In exemplary implementations described herein, server 140 may operate as a destination device by receiving one or more data units from client 110 via an intermediate device, such as network device 130. For example, server 140 may provide a service to other devices on network 100, such as client 110.

Client 110 may communicate with network device 130 and/or server 140 using connections associated with a primary data network, such as network 120. Alternatively, client 110 may communicate with network device 130 and/or server 140 using a dedicated network and/or link. A link may be a dedicated physical or virtual link and may include encryption protocols for protecting the content of communications between client 110 and a destination device, such as network device 130 and/or server 140.

Exemplary Functional Diagram

Figure 2:
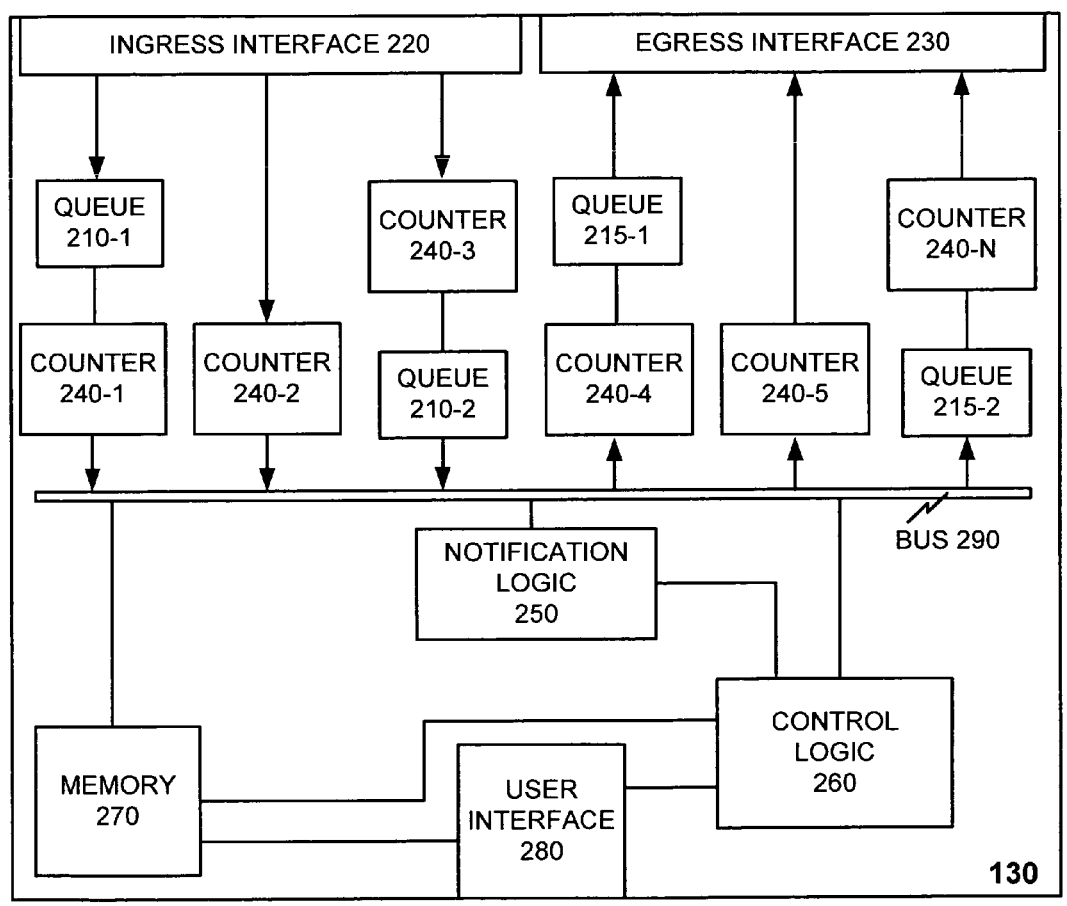
FIG. 2 illustrates an exemplary functional block diagram of a network device according to an implementation consistent with the principles of the invention.

FIG. 2 illustrates an exemplary functional block diagram of network device 130 according to an implementation consistent with the principles of the invention. Network device 130 may include ingress queues 210-1 to 210-2 (hereinafter collectively ingress queue(s) 210), egress queues 215-1 to 215-2 (hereinafter collectively egress queue(s) 215), ingress interface 220, egress interface 230, counters 240-1 to 240-N (hereinafter collectively counter(s) 240), notification logic 250, control logic 260, memory 270, user interface 280, and bus 290.

Ingress queue 210 may include a device capable of holding data units and/or data unit information that is received from ingress interface 220, control logic 260, and/or memory 270. For example, in one implementation, queues 210-1 to 210-2 may operate as buffers that receive data unit information from ingress interface 220. Queues 210-1 to 210-2 may store the information until it is sent to another device, such as control logic 260. Control logic 260 may operate on the received information to produce processed data unit information. Processed data unit information may include information about a data unit that has had an operation performed thereon. For example, processing a data unit may include manipulating information included in the data unit, formatting the data unit, and/or encapsulating the data unit. Processed data unit information and/or processed data units may be provided to egress queues 215. Egress queues 215 may include devices capable of holding data unit information and/or data units. Egress queues 215 may be configured to send data unit information and/or data units to a device, such as egress interface 230. For example, egress queue 215 may receive processed data units from devices coupled to bus 290 and may send the processed data units to egress interface 230.

Ingress interface 220 and egress interface 230 may, respectively, include a device configured to receive and/or send data units. Interfaces 220/230 may include any receiver, transmitter, and/or transceiver-like mechanism that enables network device 130 to communicate with other devices and/or systems. For example, interfaces 220/230 may include a modem, an Ethernet interface to a LAN, a wireless transceiver for coupling a wireless network device 130 to network 120, client 110, an input/output interface associated with server 140, an input/output interface associated with network 120, etc.

Counter 240 may include a device configured to track information in network device 130. In one implementation, counter 240 may track information by maintaining a count. For example, implementations of counter 240 may count data units entering or leaving network device 130, count data unit information, such as the sizes of data units entering or leaving network device 130 (e.g., counting the number of bytes in a data unit). Implementations of counter 240 may also be configured to count other information, such as requests made to a device, such as memory 270, operating in network device 130, etc. Counts may also be based on characteristics of data units, subscribers, etc., such as priorities associated with data units, classes of traffic passing through interface 220/230, service priorities for subscribers, etc.

Counter 240 may be implemented as a register that can be incremented as needed to maintain a count. For example, counter 240 may be implemented as a register having a numbers of bits associated therewith (e.g., a 4, 8, 16, 24, 28 bit counter). An implementation of counter 240 may maintain counts by incrementing or decrementing the counter. Count information provided by counter 240 may be referred to as a counter value. Counter 240 may be configured to count data units that pass through counter 240 or data units that pass by counter 240 in a manner that allows the data units to be counted. For example, counter 240 may read 00 before receiving a packet. A first packet may pass through counter 240 and the counter value may read 01. A second packet may pass through counter 240 and the counter value may increment and read 10. Implementations of counter 240 may reference counter values with identifiers, such as addresses.

Implementations of network device 130 may use substantially any number of counters 240 consistent with the principles of the invention. Implementations may arrange counters in a hierarchy wherein an output of one counter serves as an input to another counter. Counters 240 may be located substantially anywhere in network device 130, such as between ingress queue 210-1 and bus 290, between ingress interface 220 and bus 290, between ingress interface 220 and ingress queue 210-2, between egress queue 215-1 and bus 290, between egress interface 230 and bus 290, between egress interface 230 and egress queue 215-2 and/or at other locations in network device 130, such as between memory 270 and bus 290 (not shown).

Counters 240 may count at different rates when operating in network device 130. For example, a first counter (e.g., counter 240-1) may increment at a faster rate than another counter (e.g., counter 240-4) due to greater network traffic associated with the first counter. Counters 240 may be configured to provide notifications and/or counter values to other devices, such as notification logic 250, based on parameters, such as an average anticipated traffic flow past a counter. Implementations may be configured to have all counters provide counter values at the same rate and/or may be configured to have counters provide counter values at different rates (e.g., counter 240-1 provides counter values to notification logic 250 at a first rate and counter 240-4 provides counter values to notification logic 250 at a second rate that is slower than the first rate). Counters 240 may be implemented via high speed logic, such as static random access memory (SRAM), so that counter 240 can maintain accurate counts of high speed traffic in network device 130.

Implementations of counter 240 may be configured to count data units as well as the sizes of the counted data units (e.g., the number of bytes per data unit). In this implementation, a counter register may be divided in half with one half of the register used to count packets and the other half of the register used to count a total number of bytes or the number of bytes per data unit.

Notification logic 250 may include a device that receives count information from one or more counters 240. For example, notification logic 250 may be implemented as a register that receives notification information and/or count information from a number of counters. Notification logic 250 may be implemented in logic that operates at lower speeds as compared to the speeds of logic associated with counter 240. For example, notification logic 250 may be implemented in dynamic random access memory (DRAM). Notification logic 250 may also be implemented in logic that can maintain wider counts than logic used in counter 240. For example, if counter 240 is implemented as a 16 bit register, notification logic 250 may be implemented as a 24 bit, 32 bit, 64 bit, etc., register so that notification logic 250 can maintain information associated with a number of counters in a single register entry.

Notification logic 250 may be sized according to a number of counters 240 that provide counter values to notification logic 250. Alternatively, notification logic 250 can include reserve storage space (i.e., storage space in excess of what is needed to hold one counter value from each counter). The use of reserve storage space may provide a safety margin in the event that notification logic 250 cannot pass its information to control logic 260 at a desired rate. For example, notification logic 250 may need four storage locations to store counter values from four counters 240. Notification logic 250 may be configured with reserve storage space by, for example, providing notification logic 250 with an additional 10 storage locations. The reserve storage locations may provide notification logic 250 with more time to transfer a portion of its contents to control logic 260 before notification values are overwritten.

In one implementation, notification logic 250 may be implemented as a first in first out (FIFO) register. When notification logic 250 receives a first counter value from counter 240, the first counter value may be placed in a stack of the FIFO register. A value stored in notification logic 250 may be referred to as a notification value. The notification value may include counter values associated with one or more counters. In addition, notification values may include other information associated with counter values, such as addresses associated with counter values, measurement parameters associated with counter values, etc. When notification logic 250 receives a second counter value, the second counter value may be placed below the first counter value in the FIFO stack. When information is read from notification logic 250, the topmost notification value in the FIFO stack may be read. Alternatively, multiple notification values (i.e., multiple stack entries) can be read from notification logic 250 during a single read event, such as single read event by control logic 260.

Control logic 260 may include any type of processing logic that may interpret and execute instructions. Control logic 260 may be implemented in a standalone or distributed configuration. Implementations of control logic 260 may be hardwired logic, such as application specific integrated circuits (ASICs), field programmable gate arrays (FPGAs), etc. based on desired configurations of network device 130. Control logic 260 may operate to control the operation of queues 210/215, interfaces 220/230, counters 240, notification logic 250, memory 270, and/or user interface 280. Implementations of control logic 260 may read notification values from notification logic 250. Control logic 260 may operate on notification values read from notification logic 250 and may produce statistics that can be used by an operator of network device 130 and/or other devices in network 100 to monitor the performance of network device 130.

Memory 270 may include a static and/or dynamic storage device that may store information and instructions for execution by control logic 260 and/or for use by other devices operating in network device 130. For example, an implementation of memory 270 may store data units passing through network device 130. Memory 270 may also store counter values, notification values, software used to generate statistics, and/or results produced by running statistical applications on counter values and/or notification values.

User interface 280 may include one or more interfaces, components, or mechanisms that permit a user to input information to network device 130. User interface 280 may include a keyboard, a mouse, a pen, voice recognition and/or biometric mechanisms, etc. User interface 280 may also include one or more mechanisms that output information to, for example, a user. For example, user interface 280 may include a display, a printer, one or more speakers, etc.

Bus 290 may include a device that permits communication among the components of network device 130.

Exemplary Counter

Figure 3:
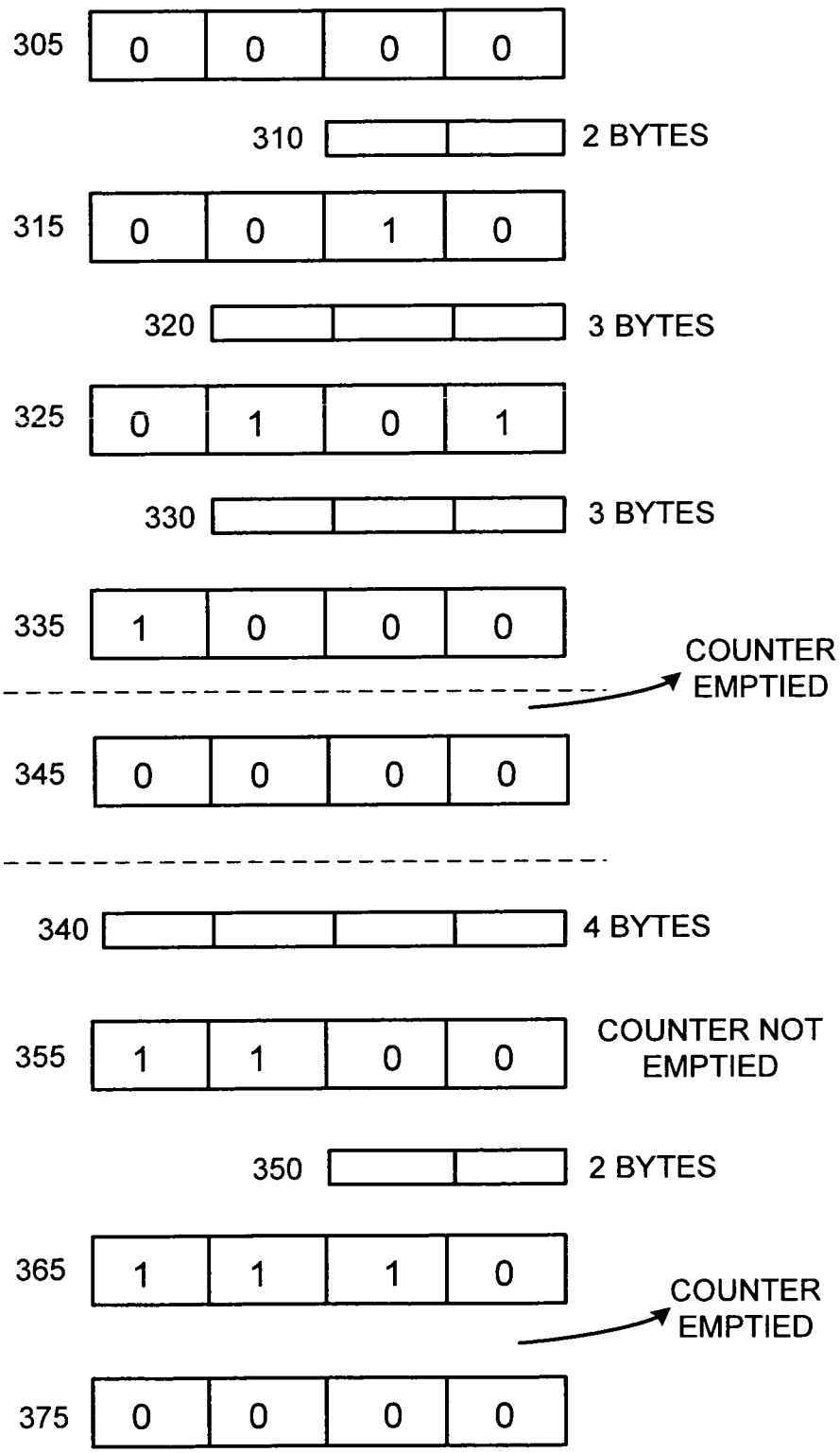
FIG. 3 illustrates an exemplary implementation of a counter consistent with the principles of the invention.

FIG. 3 illustrates an exemplary implementation of counter 240 consistent with the principles of the invention. The implementation of FIG. 3 illustrates a four bit counter 240 for purposes of discussion. Implementations of counter 240 may be implemented in configurations having substantially any number of bits consistent with the principles of the invention. Counter 240, of FIG. 3, may be used to count the number of bytes in a data unit, such as a packet. Other implementations of counter 240 may be configured to count other things, such as a number of packets and/or characteristics associated with packets. "Packet", as used in connection with FIGS. 3-6, is representative of a type of data unit that can be used with an implementation of the invention. Implementations, such as those discussed in connection with FIGS. 3-6, may also operate on other types of data units, such as cells, consistent with the principles of the invention.

Counter 240 may be initialized to a state, such as all zeros, prior to counting bytes (configuration 305). Packet 310 may be received at network device 130. Packet 310 may include 2 bytes. Counter 240 may count packet 310 and its count may be incremented based on the number of byes in packet 310. For example, counter 240 may have a counter value of "2" (configuration 315) after counting the number of bytes in packet 310. A second packet, packet 320, may be received by network device 130. Counter 240 may count three bytes in packet 320 and may produce an updated counter value based on packet 320. Counter 240 may have a counter value of "5" after counting the number of bytes in packet 320 (configuration 325). Counter 240 may receive a third packet, packet 330, that has three bytes and may produce a counter value of "8" to reflect the number of bytes in packet 330 (configuration 335).

Counter 240 may be configured to operate with notification logic 250 so that counter 240 attempts to provide a counter value to notification logic 250 when a certain condition is present, such as when counter 240 reaches a determined value. In one implementation, counter 240 may be configured to send a notification and/or a counter value to notification logic 250 when the most significant bit (MSB) of counter 240 is set (i.e., the left most bit of the counter in FIG. 3). For example, configuration 335 illustrates the MSB set to 1. Counter 240 may be configured to send a current counter value to notification logic 250 when the MSB is asserted (i.e., is set to 1). When counter 240 successfully sends a counter value to notification logic 250, counter 240 may be reset to zero (configuration 345). Notification logic 250 may store the counter value received from counter 240.

Assume notification logic 250 does not successfully read counter 240 after configuration 335. For example, notification logic 250 may not have an empty register in which to store the counter value. Further assume that packet 340 is counted by counter 240 and a new counter value is registered that includes the four bytes in packet 340 (configuration 355). Since the MSB of counter 240 is still set, counter 240 may attempt to send the current counter value to notification logic 250. If notification logic 250 does not receive the counter value, another packet may be counted. For example, packet 350 may arrive and counter 240 may increment the counter value by two bytes to reflect packet 350 (configuration 365). Counter 240 may again attempt to send the current counter value to notification logic 250 since the MSB is still asserted. If notification logic 250 accepts the counter value from counter 240 at configuration 365, counter 240 may be reset to zero (configuration 375).

Notification logic 250 may be implemented in logic that can maintain values for a number of counters 240. For example, notification logic 250 may be implemented in wide logic with respect to a logic width used for counters 240. Assume that counters 240 are each implemented in 8 bit or 16 bit logic. Notification logic 250 may be implemented as a 24, 32 or 64, etc., bit logic so that notification logic 250 can hold results for a number of counters 240 without overwriting values.

Exemplary Data Structure

Figure 4:
FIG. 4 illustrates an exemplary data structure used to store information obtained from a counter consistent with the principles of the invention.

FIG. 4 illustrates an exemplary data structure used to store information obtained from counters 240 consistent with the principles of the invention. Data structure 400 may include any mechanism or technique that can be used to store information in a computer-readable medium, such as memory 270. In an exemplary implementation, data structure 400 may include address field 410, value field 420, and miscellaneous field 430. Data structure 400 may arrange information in a row and column format to facilitate interpretation by a user of network device 130.

Address field 410 may include information that identifies an address associated with a counter value included in value field 420. The address may uniquely identify each particular counter 240 in network device 130. For example, counter 240 may include an address and a corresponding counter value. Notification logic 250 may read the address and corresponding counter value when obtaining data from counter 240. For example, a first address location 0001 may be associated with a counter value of 0010.

Value field 420 may include information associated with a value obtained from counter 240. Value field 420 may include a counter value received by notification logic 250 when counter 240 was read. Entries in value field 420 may be presented in substantially any format, such as binary, decimal, hexadecimal, etc.

Miscellaneous field 430 may include information associated with counter 240. For example, miscellaneous field 430 may include information about a link or queue that provided traffic to counter 240, error codes associated with counter 240, an identity of counter 240, etc.

Exemplary Methods

Figure 5:
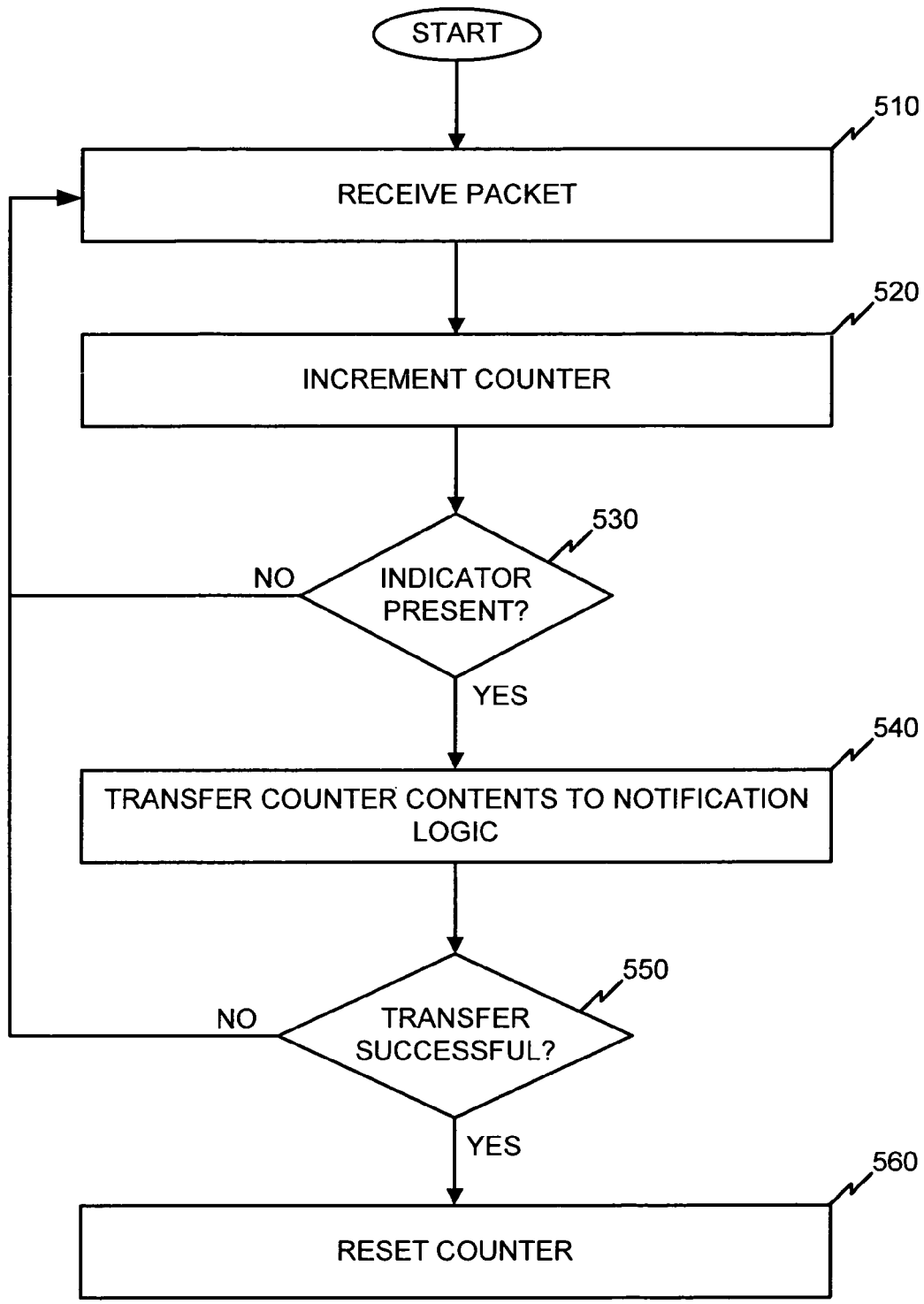
FIG. 5 illustrates an exemplary process for using a counter to count packets in a network device consistent with the principles of the invention.

FIG. 5 illustrates an exemplary process for using counter 240 to count packets in network device 130 consistent with the principles of the invention. Implementations described in connection with FIGS. 5 and 6 may employ a single counter, such as counter 240-1 for clarity. Other implementations consistent with the principles of the invention can employ substantially any number of counters 240 in substantially any configuration. For example, counters 240 may be arranged in a hierarchy with an output of a first counter feeding an input of a second counter. Implementations using multiple counters 240 may be configured so that all counters 240 provide counter values to notification logic 250 at the same rate or may be configured so that some or all of the counters 240 provide counter values to notification logic 250 at different rates. For example, counter 240 may be configured to provide counter values to notification logic 250 at a rate that takes into account a storage state of the most significant bit of each counter, the logic width of a counter, a counting speed of a counter, a priority of a counter, etc. In connection with FIGS. 5 and 6, operations performed on a single counter can be performed on multiple counters and operations performed by a single counter can be performed by multiple counters consistent with the principles of the invention.

The process of FIG. 5 may begin when counter 240-1 receives a packet (act 510). For example, a packet may be received via ingress interface 220. Ingress interface 220 may send the incoming packet to queue 210-1. Queue 210-1 may pass the packet through, or past, counter 240-1 en route to another device, such as memory 270.

Counter 240-1 may be used in network device 130 to determine if operations should be performed on packets, such as dropping a packet or forwarding a packet. Implementations of counter 240-1 may be implemented as a register in high speed logic, such as SRAM so that counter 240-1 can maintain accurate counts in high speed networking applications.

Counter 240-1 may be incremented for each packet passing by counter 240-1 or through counter 240-1 (act 520). For example, counter 240-1 may initially read 0000 (for a four bit implementation of counter 240-1). If a single packet passes from queue 210-1 to memory 270, counter 240-1 may read 0001. An implementation of network device 130 may be configured to have notification logic 250 receive counter values from counter 240-1 at certain times and/or when counter 240-1 reaches a certain value. Assume that counter 240-1 will roll approximately every ten seconds based on an average amount of incoming traffic. Counter 240-1 may be configured to provide counter values to notification logic 250 at a rate faster than one counter value every ten seconds so that counter 240-1 provides a counter value to notification logic 250 before counter 240-1 rolls under normal operating conditions. Implementations of notification logic 250 may be configured to receive counter values from counter 240-1 at a rate that is much faster than an anticipated roll rate of counter 240-1 to provide a margin of safety against unanticipated spikes in incoming traffic.

Counter 240-1 may be further configured to provide counter values to notification logic 250 when an indicator is present, such as a certain value or an asserted bit. An indicator may include any technique for indicating a status of a device, such as a status of counter 240-1. In one implementation, counter 240-1 may be configured to send counter values to notification logic 250 when a MSB in counter 240-1 is asserted (i.e., is set to 1).

A determination may be made as to whether the indicator of counter 240-1 is present (e.g., whether the MSB is set to "1") (act 530). If the indicator is not present, the process of FIG. 5 may loop back to act 510 and may accept another packet. The subsequent packet may increment counter 240-1 (act 520) and the indicator may be checked again (act 530). When the indicator is present in act 530, counter 240-1 may attempt to send its contents to notification logic 250 (act 540). Notification logic 250 may accept the entire contents of counter 240-1 and/or may accept a single value from counter 240-1, depending on the implementation of notification logic 250 and counter 240-1.

Assume that counter 240-1 is configured to pass a counter value and an address of the counter value to notification logic 250 when an indicator is present. In one implementation, counter 240-1 may clear, or reset, the counter value when passing the counter value and address to notification logic 250. If notification logic 250 is unable to accept the counter value and address, the counter value and address may be rewritten back into counter 240-1.

Implementations of counter 240-1 may be configured to push counter values and addresses to notification logic 250, or counter 240-1 may be configured to have counter values and addresses pulled therefrom by notification logic 250.

Implementations of counter 240-1 may be configured to operate with multiple indicators consistent with the principles of the invention. For example, counter 240-1 may have a width of eight bits. The width of counter 240-1 may be divided, such as by dividing counter 240-1 into two four bit portions. Counter 240-1 may be configured to store a value identifying a number of packets that have passed counter 240-1 in the lower four bits. Counter 240-1 may further be configured to store a value identifying a number of bytes contained in the counted packets in the upper four bits. Counter 240-1 may use a first indicator to identify when the lower four bits should be sent to notification logic 250 (e.g., the MSB of the lower four bits may act as the first indicator when the MSB is asserted). Counter 240-1 may use a second indicator to identify when the upper four bits should be sent to notification logic 250 (e.g., the MSB of the upper four bits may act as the second indicator when the MSB is asserted).

A determination may be made as to whether notification logic 250 successfully read the contents of counter 240-1 (act 550). When notification logic 250 successfully reads the contents of counter 240-1, counter 240-1 may be reset to a zero state (act 560). In contrast, when notification logic 250 does not successfully read the contents of counter 240-1, process flow may return to act 510 where another packet is counted by counter 240-1. Acts 520-540 may be performed on the new packet and counter 240-1 may again attempt to send its contents to notification logic 250 since the indicator (e.g., MSB) is still asserted.

In certain situations notification logic 250 may be unable to successfully read counter 240-1 before counter 240-1 rolls. For example, if an interface associated with counter 240-1 receives an unanticipated spike in traffic, counter 240-1 may roll before notification logic 250 can receive the contents of counter 240-1. If a rolled value of counter 240-1 is used to generate statistics, the statistics may be invalid because a rolled value may include invalid count data. Implementations of network device 130 may account for the above situation by having counter 240-1 generate a special sequence of register values when counter 240-1 rolls before being reset by notification logic 250. This sequence of register values may be referred to as a "roll value" since the sequence indicates that counter 240-1 has rolled. For example, counter 240-1 may produce a sequence of "1111" when it rolls. Counter 240-1 may send the rolled value to notification logic 250 since the MSB is asserted (i.e., is 1). Notification logic 250 may read the rolled value and may pass the rolled value to control logic 260. Control logic 260 may flag the rolled value as erroneous data that should not be used to compute statistics for network device 130.

Implementations of notification logic 250 may be configured to read counter 240-1 when counter 240-1 reaches certain values. For example, notification logic 250 may be configured to read a counter value when counter 240-1 is half full, three quarters full, etc. The point at which notification logic 250 reads counter 240-1 may be selected so as to reduce the chance that counter 240-1 may roll before being read by notification logic 250.

Figure 6:
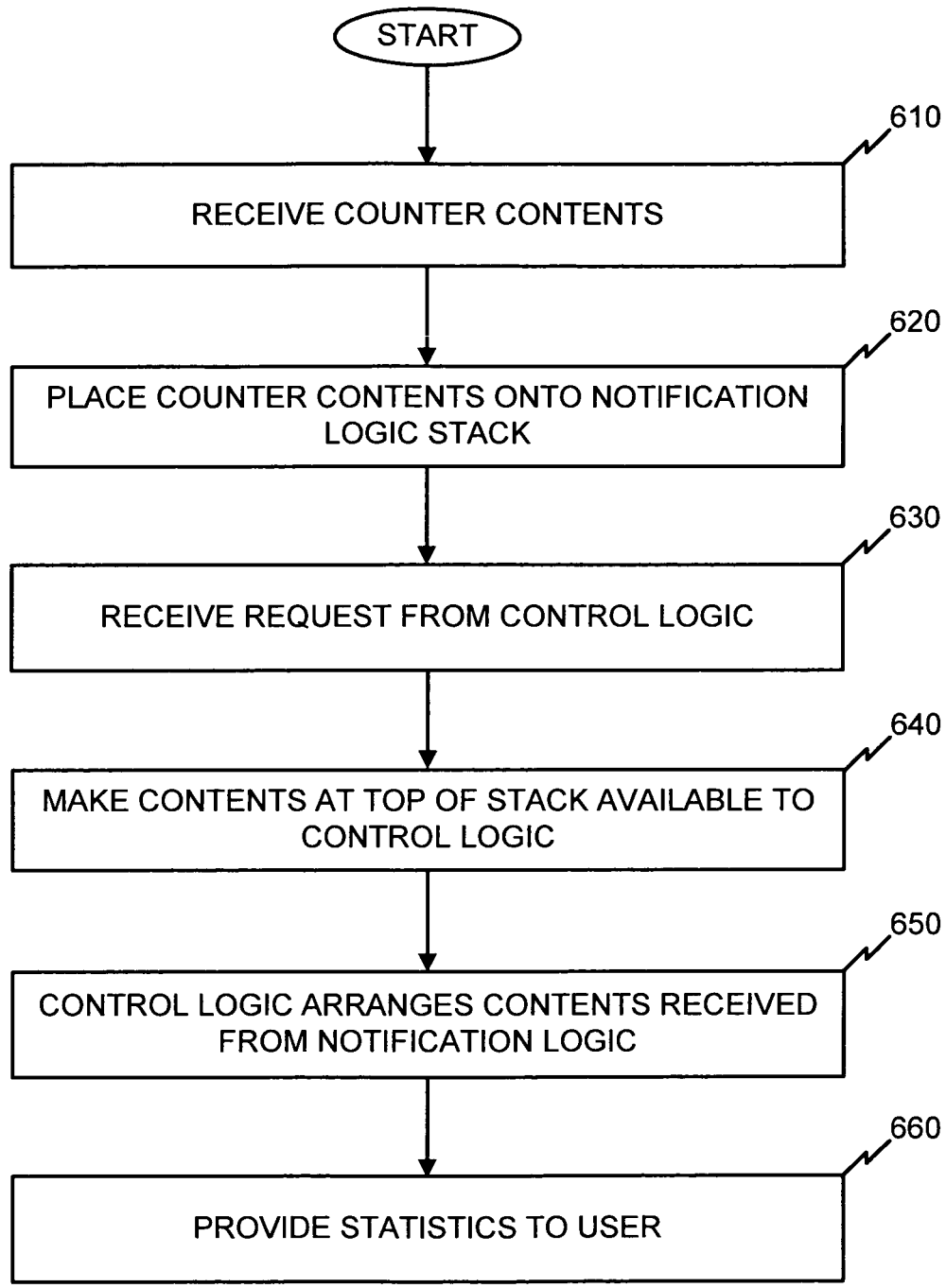
FIG. 6 illustrates an exemplary process for passing information from notification logic to control logic in an exemplary implementation consistent with the principles of the invention.

FIG. 6 illustrates an exemplary process for passing information from notification logic 250 to control logic 260 in an exemplary implementation consistent with the principles of the invention. Notification logic 250 may receive a counter value from counter 240-1 when, for example, an indicator is present (e.g., the MSB is set to "1") (act 610). Notification logic 250 may place a counter value and/or address onto a stack within notification logic 250 (act 620). For example, notification logic 250 may be implemented as a FIFO. Notification logic 250 may place a first counter value onto a first stack location and may place a second counter value onto a second stack location where the second stack location is below the first stack location. Notification logic 250 may also be configured to store additional information in stack locations, such as addresses associated with counter values, and/or counter identifiers that identify a counter from which a counter value or address was received.

Implementations of notification logic 250 may be implemented in logic having a greater width than logic used for counters 240-1. For example, counter 240-1 may be implemented as a four bit counter as shown in FIG. 3. In contrast, notification logic 250 may be implemented, for example, in 64 bit logic. As a result, notification logic 250 may be capable of containing multiple counter values in a single stack location. For example, notification logic 250 may read counter values from a first, second, third and fourth counter. Notification logic 250 may place the four counter values into a single stack location since notification logic 250 has a width of 64 bits.

Notification logic 250 may receive a request for a portion of its contents from control logic 260 (act 630). Control logic 260 may be configured to sample notification logic 250 at a sampling rate that is slower than a rate at which counter 240 provides counter values to notification logic 250. For example, in one implementation, control logic 260 may poll one or more implementations of notification logic 250. Control logic 260 may be able to sample notification logic 250 at a slow rate because a single notification logic 250 stack location can include counter values from a number of counters and/or may include a number of counter values from a single counter.

In one implementation, control logic 260 may be configured to sample notification logic 250 at a rate that is based on an average rolling rate of counter 240-1 and/or other counters, such as counters 240-2 to 240-N, operating in network device 130. The average rolling rate may identify an average rate at which a group of counters rolls. The average rolling rate may be based on an average (e.g., typical) amount of traffic expected to pass through each counter in the group. Alternatively, the average rolling rate may be based on measured traffic passing through each counter in the group.

In another implementation, control logic 260 may be configured to sample notification logic 250 at a rate that places a determined load on control logic 260. For example, a load may be placed on control logic 260 each time notification logic 250 is sampled. A desired loading value may be selected for control logic 260 and a sampling rate, used to read data from notification logic 250, may be selected so as to maintain the desired loading value.

Notification logic 250 may provide information contained in a top stack location to control logic 260 (act 640). For example, if notification logic 250 is implemented as a FIFO, the topmost position in the FIFO may be provided to control logic 260. Alternatively, notification logic 250 and/or control logic 260 may be configured so that notification logic 250 provides multiple stack locations to control logic 260 during a single sampling request.

In one implementation, control logic 260 may sample notification logic 250 before notification logic 250 rolls. In another implementation, control logic 260 may be configured to sample notification logic 250 on demand, such as when a user requests updated counter information and/or statistics. Implementations may also include control logic 260 that is notified by notification logic 250 prior to notification logic 250 producing a roll value. Control logic 260 may sample notification logic 250 upon receiving the notification.

Control logic 260 may arrange information received from notification logic 250 into a format that can be used to generate desired statistics (act 650). For example, control logic 260 may store information received from notification logic 250 in memory 270. Control logic 260 may read information associated with a number of counters 240 and/or implementations of notification logic 250 from memory 270 and may use the retrieved information to generate wide statistics (i.e., statistics wider than those associated with respective counters, such as counters 240-1 to 240-N). Control logic 260 may also perform operations on the information to facilitate interpretation of the information by a user of network device 130. For example, control logic 260 may plot statistics as a function of interface type, link type, data unit type, etc. Control logic 260 may provide statistics to a user of network device 130 (660). For example, control logic 260 may cause a plot to be displayed on a display device operated by the user.

CONCLUSION

Systems and methods consistent with the principles of the invention provide techniques for reading counters operating on network device in a way that reduces loads on logic, such as control logic.

The foregoing description of exemplary implementations consistent with the principles of the invention provides illustration and description, but is not intended to be exhaustive or to limit the invention to the precise form disclosed. Modifications and variations are possible in light of the above teachings or may be acquired from practice of the invention. For example, while series of acts have been described with regard to FIGS. 5 and 6 the order of the acts may be varied in other implementations consistent with the present invention. Moreover, non-dependent acts may be implemented in parallel.

Also, network and system implementations have been illustrated and described using a single network device, server, client and network. However, in other implementations, networks and systems may include multiple devices and may further include additional devices, such as routers, intrusion detection systems (IDSs), service gateways, proxy servers, and the like. In addition, devices, such as firewalls, may employ multiple interfaces or ports for receiving and sending data units.

While exemplary implementations have been described herein, the processing performed by one of the devices described above may be performed by another device. For example, the processing performed by network device 130 and server 140 may be performed by a single device in alternative implementations. Therefore, implementations consistent with the principles of the invention are not necessarily limited to a particular configuration.

Moreover, it will be apparent to one of ordinary skill in the art that aspects of the invention, as described above, may be implemented in many different forms of software, firmware, and hardware in the implementations illustrated in the figures. The actual software code, or specialized control hardware, used to implement aspects consistent with the principles of the invention is not limiting of the present invention. Thus, the operation and behavior of the aspects were described without reference to the specific software code, it being understood that one of ordinary skill in the art would be able to design software and control hardware to implement the aspects based on the description herein.

Further, certain portions of the invention may be implemented as "logic" that performs one or more functions. This logic may include hardware, such as hardwired logic, an application specific integrated circuit, a field programmable gate array or a microprocessor, software, or a combination of hardware and software.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The scope of the invention is defined by the claims and their equivalents.

What is claimed is:

1. A network device, comprising: a plurality of counters to count bytes of a plurality of data units passing through the network device; first logic, implemented at least partially in hardware, to: receive, from one or more of the plurality of counters and when an indicator is detected, data corresponding to a quantity of bytes of one or more data units of the plurality of data units, the first logic receiving data, from the one or more of the plurality of counters, at a first rate, the quantity of bytes being counted by the one or more of the plurality of counters, the data being received when a particular bit, of the one or more of the plurality of counters is asserted, the indicator being on the particular bit being asserted, the indicator indicating that the one or more of the plurality of counters have reached a value that is less than a value that causes the one or more of the plurality of counters to roll, and store the received data; and second logic, implemented at least partially in hardware, to: obtain the stored data, the second logic obtaining data, from the first logic, at a second rate that is slower than the first rate, generate statistics about an operation of the network device based on information, associated with the one or more data units, included in the obtained data, the information, associated with the one or more data units, including at least one of: information identifying types of the one or more data units, or information identifying sizes of the one or more data units, and provide the generated statistics to a user.

2. The network device of claim 1, where the received data comprises the information associated with the one or more data units, and
where the information associated with the one or more data units further includes information identifying priorities of the one or more data units.

3. The network device of claim 1, where the one or more of the plurality of counters include a first bit register having a first width, and
where the first logic includes a second bit register having a second width greater than the first width.

4. The network device of claim 1, where the first logic is further to:
send the received data to the second logic at the second rate.

5. The network device of claim 1, where the first logic is further to:
receive other data from another one or more of the plurality of counters at a third rate that is different than the first rate.

6. The network device of claim 1, where the particular bit corresponds to a most significant bit (MSB) of the one or more of the plurality of counters.

7. The network device of claim 1, where the received data comprises a counter value, corresponding to the quantity of bytes of the one or more data units, and an address value that are associated with the one or more of the plurality of counters, and
where the statistics are generated further based on the counter value and the address value.

8. The network device of claim 1, where the first logic is implemented in dynamic random access memory (DRAM), and
where the one or more of the plurality of counters are implemented in static random access memory (SRAM).

9. The network device of claim 1, where the second logic is further to:
plot the generated statistics based on one or more of an interface type, a link type, or a data unit type.

10. A network device, comprising: first logic, implemented at least partially in hardware, to: count a quantity of bytes of data units passing through the network device to generate a counter value; second logic, implemented at least partially in hardware, to: receive the counter value when an indicator is detected, the counter value being received at a first rate the indicator being based on a particular bit of the first logic being asserted, the indicator indicating that the first logic is reaching a particular counter value that causes the first logic to roll the counter value, and store the received counter value; and third logic, implemented at least partially in hardware, to: obtain the stored counter value, from the second logic, at a second rate, the second rate being based on an average rolling rate of the first logic, the second rate being slower than the first rate, generate statistics about an operation of the network device, the generated statistics being generated based on information associated with the obtained counter value, the information associated with the obtained counter value including: information identifying classes of traffic associated with the data units, or
information identifying types of the data units, and provide the generated statistics to a user.

11. The network device of claim 10, where the average rolling rate is based on the particular counter value,
where the first logic is further to:
count a quantity of the data units, and
where the generated statistics are generated further based on the quantity of the data units.

12. The network device of claim 10, where the first logic is further to store information, associated with the data units, that includes:
information identifying priorities of the data units,
the information identifying the classes of traffic associated with the data units, or
the information identifying the types of the data units, and
where the generated statistics are generated further based on the information identifying the priorities of the data units.

13. The network device of claim 10, where the third logic is to use the obtained counter value to determine whether to drop or forward at least one of:
the data units, or
another data unit.

14. The network device of claim 10, where the counter value includes information associated with the indicator.

15. The network device of claim 10, where the indicator includes the particular bit, and
where the particular bit indicates that the first logic is reaching the particular counter value.

16. The network device of claim 10, where the third logic is further to obtain a plurality of counter values from the second logic at the second rate,
the plurality of counter values corresponding to a quantity of bytes of a plurality of data units passing through the network device.

17. The network device of claim 10, where the first logic is further to provide the counter value to the second logic prior to the counter value reaching the particular counter value.

18. The network device of claim 10, where the first logic is further to:
generate a particular value that is based on the indicator when the first logic exceeds the particular counter value, and
where, when generating the statistics, the third logic is to:
determine, based on the particular value, that the first logic has exceeded the particular counter value, and
generate the statistics independent of the particular value.

19. The network device of claim 10, where the second logic is further to:
store an address of the first logic; and
provide the address to the third logic.

20. The network device of claim 10, where the second logic comprises a first in first out (FIFO) register.

21. The network device of claim 10, where the first logic is associated with static random access memory (SRAM) and the second logic is associated with dynamic random access memory (DRAM).

22. The network device of claim 10, where the generated statistics are based on:
the obtained counter value, and
a plurality of other counter values corresponding to quantities of bytes of other data units passing through the network device.

23. A method comprising: receiving, by a first component of a device, a counter value from a particular data unit counter of a plurality of data unit counters of the device, the first component receiving counter values, from the particular data unit counter, at a first rate, the counter value corresponding to a quantity of bytes of data units passing through the device, the counter value being received based on when an indicator is detected receiving the counter value comprising receiving the counter value, from the particular data unit counter, when a particular data unit counter, is asserted, the indicator being based on the particular bit being asserted and the indicator indicating that the particular data unit counter is reaching a particular count value that causes the particular data unit counter to roll; storing, by the first component of the device, the counter value; receiving, by the first component of the device and from a second component of the device, a request for a plurality of counter values, generated by one or more of the plurality of data unit counters, that include the counter value received from the particular data unit counter, the first component receiving requests for counter values, from the second component, at a second rate that is slower than the first rate; sending, the first component of by the device, the plurality of counter values to the second component based on the request; generating, by the device and based on information associated with the plurality of counter values, statistics about a plurality of data units passing through the device, the information associated with the plurality of counter values including at least one of: information identifying classes of traffic associated with the plurality of data units, or information identifying types of the plurality of data units; and providing, by the device, the generated statistics for presentation to a user.

24. The method of claim 23, further comprising:
sending an address at which the counter value is stored, where the address is associated with the particular data unit counter.

25. The method of claim 23, where receiving the counter value comprises:
receiving at least one of the plurality of counter values at a third rate that is different than the first rate, and
where the second rate is based on an average rate of the plurality of data unit counters rolling.

26. The method of claim 23, where the particular bit corresponds to a most significant bit of the particular data unit counter.

27. The method of claim 23, where sending the plurality of counter values comprises:
sending information associated with the data units,
the information associated with the data units including at least one of:
information identifying priorities of the plurality of data units,
the information identifying the types of the plurality of data units, or
the information identifying the classes of traffic associated with the plurality of data units.

28. The method of claim 23, where another data unit counter, of the plurality of data unit counters, counts bytes of one or more data units passing through the device,
where the other data unit counter generates a roll value when the other data unit counter rolls,
where sending the plurality of counter values comprises:
sending the roll value, and
where the statistics are generated independent of the roll value.

29. A network device, comprising: to a plurality of components, implemented at least partially in hardware, including: a first component to: read one or more counter values that are generated based on a plurality of counters of the network device counting a quantity of bytes of data units, the one or more counter values being read at a first rate, and the one or more counter values being read when an indicator is detected, the indicator being based on a particular bit, of the plurality of counters, that is asserted, and store the one or more counter values; and a second component to: read the stored one or more counter values at a second rate that is slower than the first rate, the second rate being based on an average rolling rate of the plurality of counters, generate statistics, about a performance of the network device, based on information associated with the stored one or more counter values read at the second rate,
the information associated with the stored one or more counter values including a plurality of:
information identifying classes of traffic associated with the plurality of data units,
information identifying types of the plurality of data units or information identifying sizes of the plurality of data units, and provide the statistics for presentation to a user, the provided statistics including information identifying: statistics related to an interface type associated with the network device, and statistics related to a link type associated with the network device.

30. The network device of claim 29, where at least one of the plurality of counters includes a register,
where one portion of the register is used to count one or more data units passing through the network device, where another portion of the register is used to count a total number of bytes of the one or more data units or a number of bytes per data unit of the one or more data units, and where the statistics are generated further based on at least one of:
  the counted one or more data units, or
  the total number of bytes of the one or more data units or the number of bytes per data unit of the one or more data units.

31. The method of claim 23, further comprising:
counting one or more data units, passing through the device, using a portion of a register of the particular data unit counter; and
counting a total number of bytes of the one or more data units using another portion of the register,
where generating the statistics includes generating the statistics further based on:
  the counted one or more data units, and
  the total number of bytes.

32. The network device of claim 1, where a size of the first logic is associated with a number of the plurality of counters.

* * * * *

UNITED STATES PATENT AND TRADEMARK OFFICE
CERTIFICATE OF CORRECTION

PATENT NO. : 8,923,124 B1
APPLICATION NO. : 11/342625
DATED : December 30, 2014
INVENTOR(S) : John C. Carney et al.

Page 1 of 1

It is certified that error appears in the above-identified patent and that said Letters Patent is hereby corrected as shown below:

In the Claims

Please correct Claim 1 as follows:

Column 13, line 31, after "the indicator being" insert -- based --.

Signed and Sealed this
Fourth Day of August, 2015

Michelle K. Lee
*Director of the United States Patent and Trademark Office*